(12) United States Patent
Aoyagi et al.

(10) Patent No.: US 8,537,527 B2
(45) Date of Patent: Sep. 17, 2013

(54) MOUNTING BOARD AND DISPLAY DEVICE

(75) Inventors: Akiyoshi Aoyagi, Kanagawa (JP); Eizo Okamoto, Kanagawa (JP)

(73) Assignee: Sony Corporation, Tokyo (JP)

( * ) Notice: Subject to any disclaimer, the term of this patent is extended or adjusted under 35 U.S.C. 154(b) by 504 days.

(21) Appl. No.: 12/702,913

(22) Filed: Feb. 9, 2010

(65) Prior Publication Data

US 2010/0214728 A1 Aug. 26, 2010

(30) Foreign Application Priority Data

Feb. 20, 2009 (JP) ................. P2009-037689

(51) Int. Cl.
*H05K 7/00* (2006.01)
*H05K 1/09* (2006.01)

(52) U.S. Cl.
USPC ........ 361/679.01; 174/257; 349/43; 349/149; 349/150; 349/151; 349/152; 257/59; 257/72; 257/734; 257/735; 438/149; 438/257; 438/694; 438/735

(58) Field of Classification Search
USPC ...................... 361/679.01; 174/257
See application file for complete search history.

(56) References Cited

U.S. PATENT DOCUMENTS

2007/0045516 A1* 3/2007 Hong .................. 250/208.1

FOREIGN PATENT DOCUMENTS

| JP | 2003-216055 | 7/2003 |
|----|-------------|--------|
| JP | 2005-049559 | 2/2005 |
| JP | 2006-140247 | 6/2006 |
| JP | 2008-28145  | 2/2008 |
| WO | 2007-139076 | 12/2007 |

OTHER PUBLICATIONS

Japanese Office Action for corresponding JP2009-037689 dated Feb. 16, 2011.
Japanese Patent Office, Decision of dismissal of amendment issued in connection with Japanese Patent Application No. 2009-037689, dated Jun. 21, 2012. (3 pages).

* cited by examiner

*Primary Examiner* — Tuan T Dinh
*Assistant Examiner* — Mukund G Patel
(74) *Attorney, Agent, or Firm* — K&L Gates LLP

(57) ABSTRACT

A mounting board includes two or more metal layers including the outermost metal layer, and a plurality of metal portions, both of which are formed on a substrate. The plurality of metal portions are formed between a first metal layer of the two or more metal layers and a second metal layer of the two or more metal layers, the first metal layer being the outermost metal layer and the second metal layer being different from the outermost metal layer. The second metal layer includes a plurality of first wiring layers extending in a first direction in a plane. The first metal layer is arranged in zigzags in a second direction intersecting with the first direction and includes a plurality of contact pads connected correspondingly to the plurality of first wiring layers through the metal portions.

10 Claims, 4 Drawing Sheets

MOUNTING BOARD AND DISPLAY DEVICE

CROSS REFERENCES TO RELATED APPLICATIONS

The present application claim priority to Japanese Priority Patent Application JP 2009-037689 filed in the Japan Patent Office on Feb. 20, 2009, the entire content of which is hereby incorporated by reference.

BACKGROUND

The present application relates to a mounting board equipped with mounting terminals thereon and a display device including the same.

In the related art, as methods for mounting driving ICs on a display panel, there have been widely used a chip-on-glass (COG) mounting method in which a gold bump of a driving IC is electrically connected to a contact pad formed on a glass substrate, with an anisotropic conductive film (ACF) interposed therebetween. The anisotropic conductive film is made by dispersing conductive particles in an insulating thermosetting adhesive.

With the recent higher resolution for images, pixel pitches have been smaller and smaller and, accordingly, pitches of lead-out wirings for connecting pixels to contact pads also become narrower and narrower. For the purpose of securing a contact pad area necessary to secure conductivity exhibited by an anisotropic conductive film as the wiring pitches become narrower, for example, Japanese Unexamined Patent Application Publication No. 2008-28145 discloses a method in which contact pads are arranged in zigzags.

SUMMARY

However, the method disclosed in Japanese Unexamined Patent Application Publication No. 2008-28145 has a possibility of short-circuit between adjacent contact pads and wirings from the relationship between the conductivity of the anisotropic conductive film and its anisotropy if wiring pitches become further narrower to reach, for example, equal to or less than 35 μm as the contact pads are interposed between the wirings. However, if the width (area) of the contact pads is made smaller with such narrow pitches in order to secure a margin necessary to avoid such short-circuit between the contact pads and the wirings, it becomes difficult to secure sufficiently the area of the contact pads, which may result in a higher resistive anisotropic conductive film.

Moreover, as disclosed in Japanese Unexamined Patent Application Publication No. 2008-28145, since the contact pads are provided in the bottom of an opening formed in an insulating layer covering the wirings, a gold bump of a driving IC is likely to ride on an end of the opening when the driving IC is mounted on a board, which may result in difficulty in securing electrical connectivity of the anisotropic conductive film.

It is desirable to provide a mounting board which is capable of sufficiently securing an area of contact pads and electrical connectivity of an anisotropic conductive film even under narrow pitches, and a display device including the same.

According to an embodiment, a mounting board includes two or more metal layers including the outermost metal layer, and a plurality of metal portions, both of which are formed on a substrate. The plurality of metal portions are formed between a first metal layer of the two or more metal layers and a second metal layer of the two or more metal layers, the first metal layer being the outermost metal layer and the second metal layer being different from the outermost metal layer. The second metal layer includes a plurality of first wiring layers extending in a first direction in a plane. The first metal layer is arranged in zigzags in a second direction intersecting with the first direction and includes a plurality of contact pads connected correspondingly to the plurality of first wiring layers through the metal portions.

According to another embodiment, a display device includes a display panel and a driving IC. The display panel includes an image display region and a frame region which surrounds the image display region and the driving IC is mounted on the frame region. The display panel includes two or more metal layers including the outermost metal layer, and a plurality of metal portions in the frame region. The plurality of metal portions is formed between a first metal layer of the two or more metal layers, the first metal layer being the outermost metal layer, and a second metal layer of the two or more metal layers, the second metal layer being different from the outermost metal layer. The second metal layer includes a plurality of first wiring layers extending in a first direction in a plane. The first metal layer is arranged in zigzags in a second direction intersecting with the first direction and includes a plurality of contact pads connected correspondingly to the plurality of first wiring layers through the metal portions. The driving IC is connected to the plurality of contact pads.

In the mounting board and the display device according to the above embodiments, the plurality of zigzag-arranged contact pads is correspondingly connected, through the metal portions, to the plurality of first wiring layers provided in a layer different from that of the contact pads. This allows the width of the contact pads in the second direction to be wider than a pitch of the first wiring layers. As a result, even if the pitch of the first wiring layer is small, it is possible to secure an area allowing the resistance of an anisotropic conductive film to be sufficiently small in the contact pads. In addition, the contact pads are provided on the outermost metal layer and accordingly no obstacle is present in the neighbors of the contact pads. This allows at least a portion of bumps of the driving IC to be securely mounted on the contact pads, for example, when the driving IC is mounted on a substrate.

As described above, in the mounting board and the display device according to the above embodiments, the plurality of contact pads arranged in zigzags on the outermost metal layer is correspondingly connected, through the metal portions, to the plurality of first wiring layers provided in a layer different from that of the contact pads. This makes it possible to secure sufficiently the area of the contact pads and the electrical connectivity of the anisotropic conductive film under narrow pitches.

Additional features and advantages are described herein, and will be apparent from the following Detailed Description and the figures.

DETAILED DESCRIPTION

Figure 1:
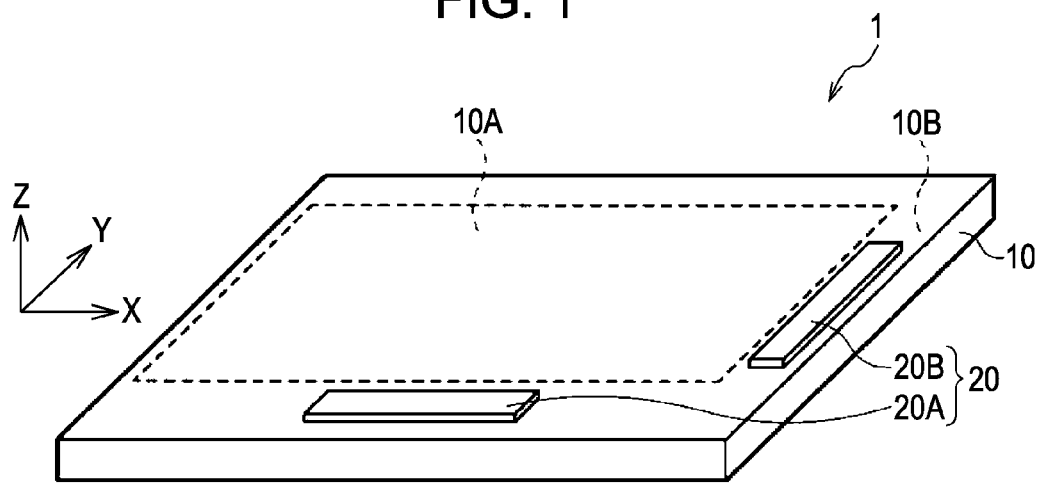
FIG. 1 is a perspective view of a display device according to an embodiment.

The present application will be described in detail with reference to the accompanying drawings according to an embodiment. The following description will be given in order as below:

1. Configuration of Display Device
Display Panel, Driving IC, and Anisotropic Conductive Film
2. Operation and Effects of Display Device
3. Modifications FIG. 1 is a perspective view of an example of general configuration of a display device 1 according to an embodiment of the present application. The display device 1 according to this embodiment is a so-called LED display employing LEDs as display pixels. The display device 1 includes a display panel 10 (mounting board) and a driving IC 20, as shown in FIG. 1.

[Display Panel 10]

Figure 2:
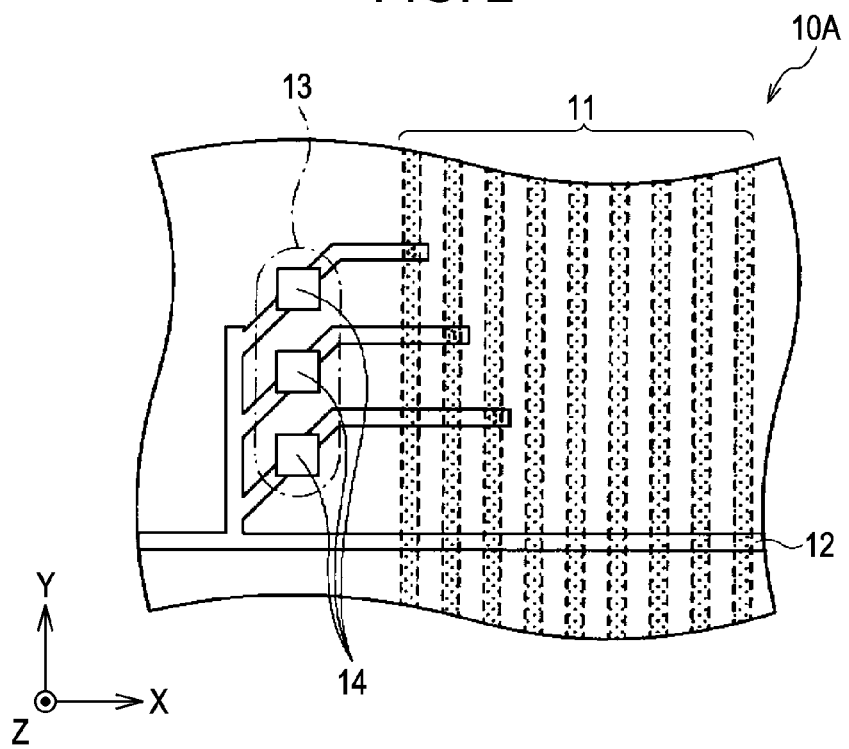
FIG. 2 is a top view of an image displaying region of FIG. 1.

The display panel 10 includes an image display region 10A and a loop-like frame region 10B surrounding the image display region 10A, which are formed on one surface of the display panel 10. In the image display region 10A, for example, as shown in FIG. 2, a plurality of data lines 11 (first wiring layer and second metal layer) is formed to extend in a vertical direction (first direction, or upward/downward in the figure) and is arranged in parallel with a predetermined pitch P1. In addition, in the image display region 10A, a plurality of scan lines 12 (second wiring layer and first metal layer) is formed to extend in a direction perpendicular to the data lines 11, specifically, a horizontal direction (third direction, or left/right in the figure) and is arranged in parallel with a predetermined pitch P2. The pitch P1 is, for example, equal to or greater than 35 m, which is smaller than the pitch P2.

The data lines 11 and the scan lines 12 intersect with each other (are mutually perpendicular in FIG. 2) in the image display region 10A when viewed from a normal direction of the substrate 15. The scan lines 12 are formed on the outermost surface, for example, and the data lines 11 are formed on a layer different from (for example, below the outermost surface) the outermost surface including the scan lines 12. A plurality of display pixels 13 is arranged in the form of a matrix at intersections of the data lines 11 and the scan lines 12 in the image display region 10A.

The display pixels 13 each include, for example, one or more light emitting elements 14 mounted thereon. For example, as illustrated in FIG. 2, one display pixel 13 includes three light emitting elements 14 to emit a three-primary color of RGB from the one display pixel 13. These light emitting elements 14 are, for example, light emitting diodes (LEDs). The light emitting elements 14 are provided with a pair of electrodes (not shown) for introducing current thereinto, with one of the electrodes electrically connected to the data lines 11 and the other electrically connected to the scan lines 12.

[Mounting Portion 10B-1]

Figure 3A:
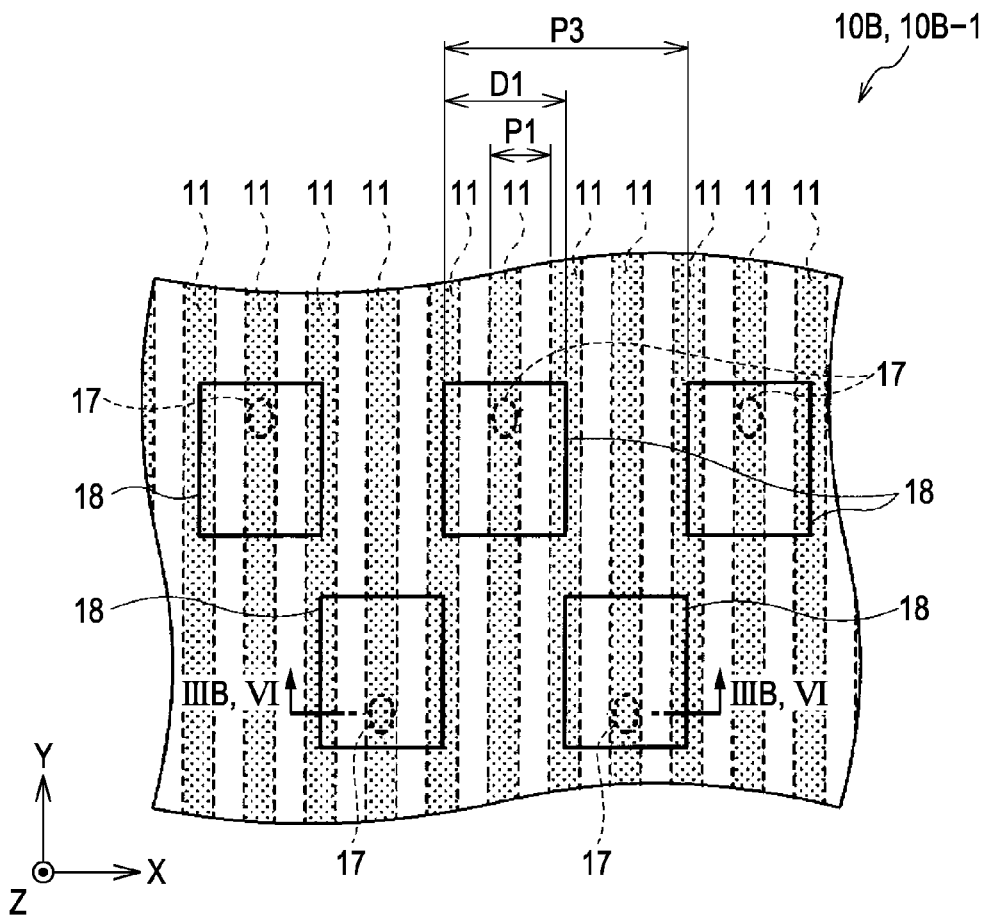
FIGS. 3A and 3B are a top view and a sectional view for a portion of a frame region of FIG. 1, respectively.
Figure 3B:
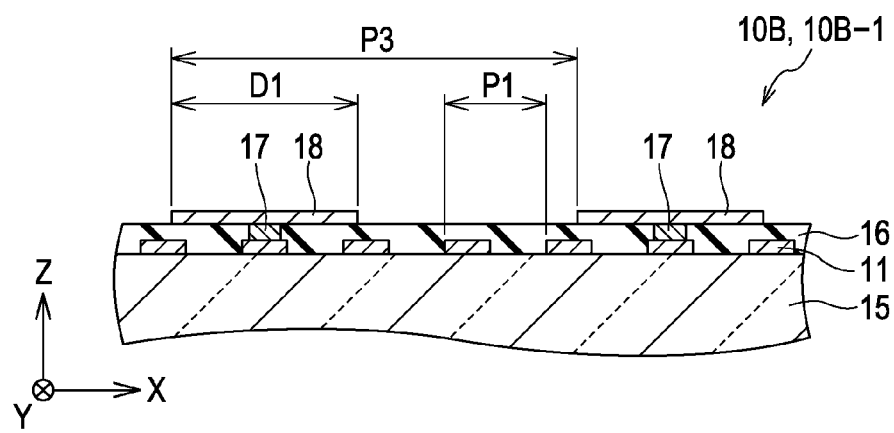

FIG. 3A illustrates an example of top side configuration of a portion (mounting portion 10B-1), on which a driving IC 20A (which will be described later) is mounted, of the frame region 10B of the display panel 10. FIG. 3B illustrates an example of sectional configuration when viewed in an arrow direction IIIB-IIIB of FIG. 3A. The display panel 10 includes, for example, a substrate 15, a plurality of data lines 11, an interlayer insulating film 16, a plurality of vias 17 (metal portions), and a plurality of contact pads 18 in the mounting portion 10B-1.

The substrate 15 is made of, for example, glass or resin. The data lines 11 are made of, for example, conductive material such as copper (Cu) or the like and are formed on, for example, a surface of the substrate 15. The interlayer insulating film 16 is made of, for example, insulating material such as SiO2 or the like and covers the entire surface of the substrate 15 including the data lines 11.

The vias 17 are made of, for example, conductive material such as Au (gold) plate or the like. The vias 17 are formed between a layer including the data lines 11 and a layer (outermost layer) including the contact pads 18 and each make electrical contact between one data line 11 and one contact pad 18. The plurality of vias 17 is arranged in zigzags in a direction (second direction) intersecting with an extension direction of the data lines 11, as shown in FIG. 3A. In addition, although it is illustrated in FIG. 3A that the plurality of vias 17 is horizontally arranged in two columns, the vias may be horizontally arranged in three or more columns.

The contact pads 18 correspond to a portion on which bumps (which will be described later) of the driving IC 20A are to be mounted, and are made of, for example, conductive material such as Au (gold) or the like. The contact pads 18 are formed on a surface of the interlayer insulating film 16, i.e., the outermost surface, in the mounting portion 10B-1, such that the neighbors of the contact pads 18 become lower than the top side of the contact pads 18. The plurality of contact pads 18 is, for example, formed immediately on the vias 17 in a one-to-one correspondence, and is electrically connected to the data lines 11 through the vias 17, respectively. The plurality of contact pads 18 is arranged in zigzags in the direction (second direction) intersecting with the extension direction of the data lines 11, like the plurality of vias 17, as shown in FIG. 3A. In addition, although it is illustrated in FIG. 3A that the plurality of contact pads 18 is horizontally arranged in two columns, the contact pads may be horizontally arranged in three or more columns according to the layout of the vias 17. A pitch P3 in one column of the contact pads 18 is wider than the pitch P1 of the data lines 11. In addition, a width D1 of the contact pads 18 in the horizontal direction is also wider than the pitch P1 of the data lines 11.

[Mounting Portion 10B-2]

Figure 4A:
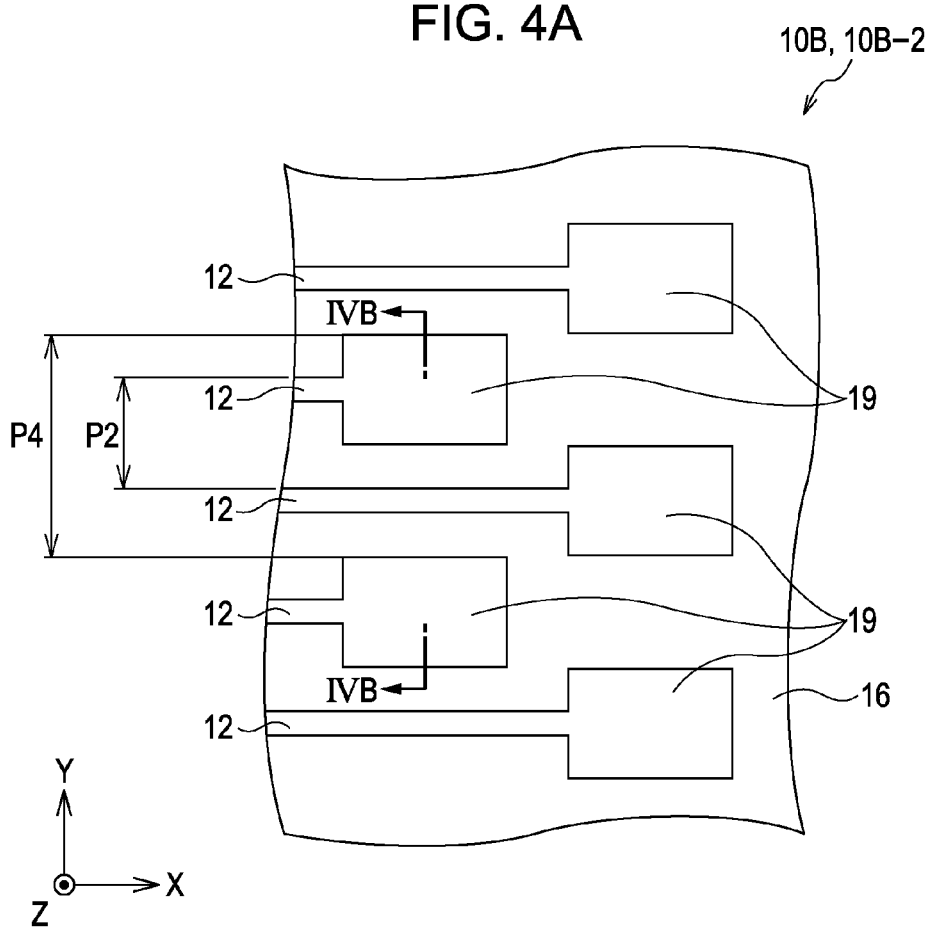
FIGS. 4A and 4B are a top view and a sectional view for another portion of a frame region of FIG. 1, respectively.
Figure 4B:
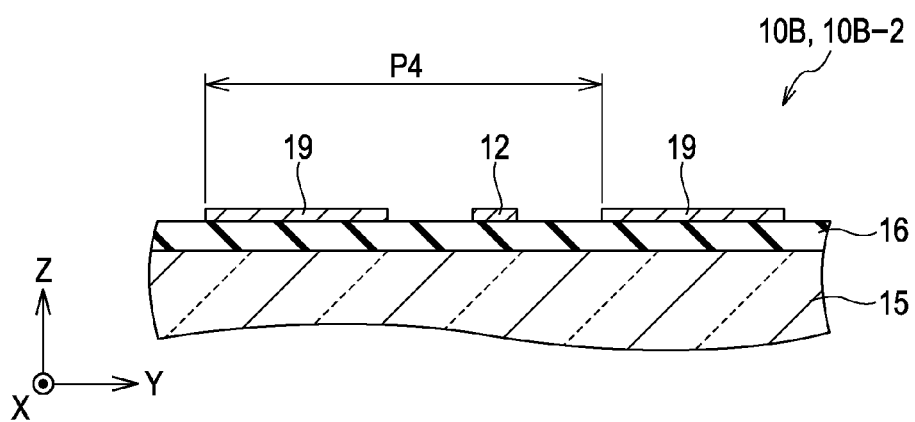

FIG. 4A illustrates an example of top side configuration of a portion (mounting portion 10B-2), on which a driving IC 20B (which will be described later) is mounted, of the frame region 10B of the display panel 10. FIG. 4B illustrates an example of sectional configuration when viewed in an arrow direction IVB-IVB of FIG. 4A. The display panel 10 includes, for example, a substrate 15, an interlayer insulating film 16, a plurality of scan lines 12, and a plurality of contact pads 19 in the mounting portion 10B-2.

The scan lines 12 are made of, for example, conductive material such as Cu (copper) or the like and are formed on a surface of the interlayer insulating film 16, that is, the outermost surface. The contact pads 19 correspond to a portion on which bumps (which will be described later) of the driving IC 20B are to be mounted, and are made of, for example, conductive material such as Au (gold) or the like. The contact pads 19 are formed on the surface of the interlayer insulating film 16, i.e., the outermost surface, in the mounting portion 10B-2, so that the neighbors of the contact pads 19 have the same height as or lower than the top side of the contact pads 19. The contact pads 19 are, for example, arranged at ends of the scan lines 12 and are electrically connected to the scan lines 12. The plurality of contact pads 19 is arranged in zigzags in a direction intersecting with an extension direction of the scan lines 12, for example, as shown in FIG. 4A. In addition, although it is illustrated in FIG. 4A that the plurality of contact pads 19 is vertically arranged in two rows, the contact pads may be vertically arranged in three or more rows. A pitch P4 in one row of the contact pads 19 is wider than the pitch P2 of the scan lines 12.

[Driving IC 20]

Driving IC 20 includes two driving ICs 20A and 20B, for example, as shown in FIG. 1. The driving IC 20A is a data driver for driving the data lines 11 connected to the display pixels 13, and is formed of a slender bar-like chip, for example, as shown in FIG. 1. The driving IC 20A includes a semiconductor chip 21, a plurality of electrode pads 22, and a plurality of bumps 23 formed correspondingly on the electrode pads 22, as shown in FIG. 5.

The electrode pads 22 and the bumps 23 are all disposed on the rear surface (mounting surface) of the semiconductor chip 21 and are made of, for example, conductive material such as Au or the like. Although not shown, the driving IC 20A has also its rear side formed thereon with other electrode pads and bumps, which are connected to external devices and are also made of, for example, conductive material such as Au or the like.

Figure 5:
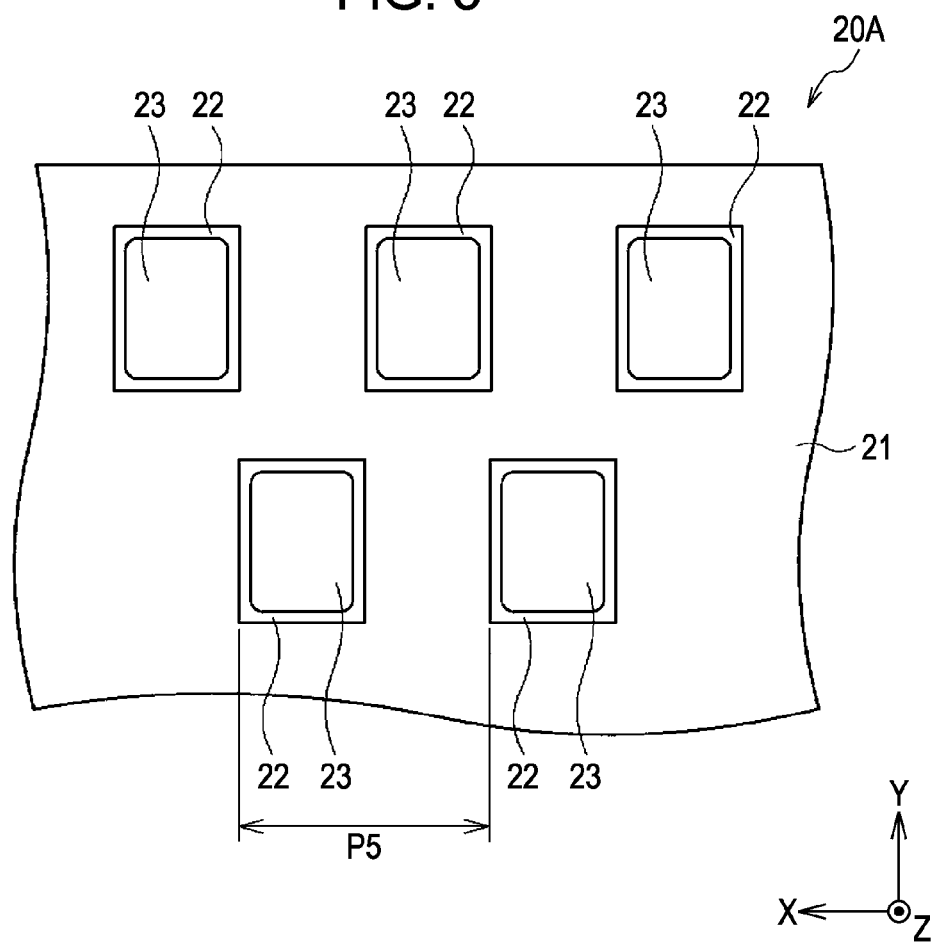
FIG. 5 is a rear view of a driving IC.

The plurality of electrode pads 22 and the plurality of bumps 23 are arranged in zigzags in an extension direction of the driving IC 20A, for example, as shown in FIG. 5. In addition, although it is illustrated in FIG. 5 that the plurality of electrode pads 22 and the plurality of bumps 23 are arranged in two rows, the pads and the bumps may be arranged in three or more rows depending on a layout of the contact pads 18. A pitch P5 in one row of the electrode pads 22 and the bumps 23 is equal to the pitch P3 of the contact pads 18.

The driving IC 20B is a scan driver for driving the scan lines 12 connected to the display pixels 13, and is formed of a slender bar-like chip, for example, as shown in FIG. 1. Although not shown, the driving IC 20B includes a plurality of electrode pads and a plurality of bumps formed correspondingly on the electrode pads, both of which are formed on a rear side (mounting surface) of the driving IC 20B, for example, like the driving IC 20A.

The electrode pads and bumps of the driving IC 20B are all connected to wirings at the display pixels 13 side and are made of, for example, conductive material such as Au or the like. Although not shown, the driving IC 20B has also its rear side formed thereon with other electrode pads and bumps, which are connected to external devices and are also made of, for example, conductive material such as Au or the like.

In the driving IC 20B, the plurality of electrode pads and the plurality of bumps are arranged in zigzags in an extension direction of the driving IC 20B, for example, depending on a layout of the contact pads 19. A pitch in one row of the electrode pads and the bumps is equal to the pitch P4 of the contact pads 19.

[Anisotropic Conductive Film 30]

Figure 6:
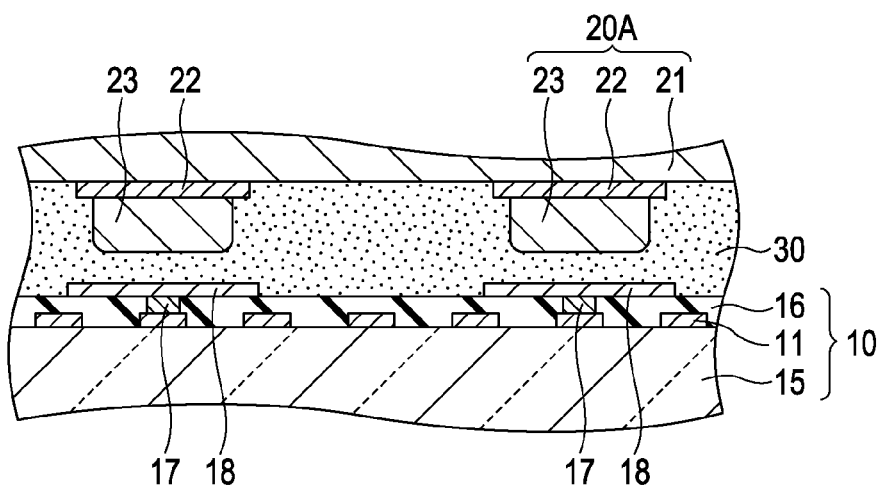
FIG. 6 is a sectional view of a portion of the display device of FIG. 1.

FIG. 6 illustrates an example of sectional view of a portion corresponding to line VI-VI of FIG. 3 in the display device 1. An anisotropic conductive film (ACF) 30 is formed between the mounting portion 10B-1 of the display panel 10 and the driving IC 20A. The anisotropic conductive film 30 has anisotropic conductivity obtained by dispersing conductive particles in an insulating thermosetting adhesive. The anisotropic conductive film 30 allows conductive members to make electrical contact therebetween, for example, by interposing (pressing) the anisotropic conductive film 30 therebetween while pressurizing these conductive members.

As shown in FIG. 6, the bumps 23 of the driving IC 20A project toward the display panel 10 and the contact pads 18 on the display panel 10 project toward the driving IC 20A. This allows the anisotropic conductive film 30 to be locally pressed by the bumps 23 of the driving IC 20A and the contact pads 18 of the display panel 10 when the driving IC 20A is mounted on the display panel 10. Accordingly, the bumps 23 and the contact pads 18, which are faced with each other, are electrically connected through the anisotropic conductive film 30. Although it is illustrated in FIG. 6 that the bumps 23 are directly faced with the contact pads 18, for example, the bumps 23 may be deviated from the contact pads 18 in an in-plane direction as long as the bumps 23 are partially faced with the contact pads 18.

In addition, although not shown, an anisotropic conductive film is formed between the mounting portion 10B-2 of the display panel 10 and the driving IC 20B, thereby allowing the contact pads 19 of the display panel 10 to be electrically connected to the bumps of the driving IC 20B.

[Operation and Effects of Display Device 1]

In this embodiment, the display pixels 13 are driven by the data lines 11 and the scan lines 12 arranged in the form of a simple matrix (simple matrix driving). To that end, a metal layer including the plurality of data lines 11 and a metal layer including the plurality of scan lines 12 are necessarily stacked on the substrate 15 through the interlayer insulating film 16 and the like. Accordingly, it is possible to form the electrode pads 18 drawn out of the data lines 11 in the metal layer including the scan lines 12 instead of forming the electrode pads 18 in the metal layer including the data lines 11. In other words, the electrode pads 18 can be formed in a metal layer different from the metal layer including the data lines 11 without adding a separate manufacturing process. Accordingly, the display panel 10 can be manufactured using any of typical manufacturing processes.

In addition, in this embodiment, as shown in FIGS. 3A and 3B, the plurality of zigzag-arranged contact pads 18 is correspondingly connected, through the vias 17, to the plurality of data lines 11 provided in a layer different from that of the contact pads 18. This allows the width D1 of the contact pads 18 in the horizontal direction to be wider than the pitch P1 of the data lines 11. As a result, even if the pitch P1 of the data lines 11 is small, it is possible to secure an area (for example, more than 2000 μm2) allowing the resistance of the anisotropic conductive film 30 to be sufficiently small in the contact pads 18. In addition, since the contact pads 18 are provided on the outermost surface and accordingly no obstacle is present in the neighbors of the contact pads 18, it is possible to mount securely at least a portion of the bumps 23 of the driving IC 20A on the contact pads 18, for example, when the driving IC 20A is mounted on the display panel 10. As described above, in this embodiment, even if the pitch P1 of the data lines 11 becomes narrower than it has ever been before, it is possible to secure sufficiently the area of the contact pads 18 and the electrical connectivity of the anisotropic conductive film 30.

Although the present application has been illustrated in the above by way of a certain embodiment, the present application is not limited to such an embodiment but may be modified in various ways.

For example, although it has been illustrated in the above embodiment that the principle of the present application is applied to the lines (data lines 11) extending in the vertical direction and the driving IC (driving IC 20A) for driving the lines, it should be understood that the principle of the present application may be applied to the lines (scan lines 12) extending in the horizontal direction and the driving IC (driving IC 20B) for driving the lines.

In addition, although it has been illustrated in the above embodiment that two metal layers (the metal layer including the plurality of data lines 11 and the metal layer including the plurality of scan lines 12) are formed on the substrate 15, it should be understood that three or more metal layers may be formed thereon.

In addition, although it has been specifically illustrated in the above embodiment that the principle of the present application is applied to an LED display, it should be understood that the principle of the present application may be applied to other displays. Furthermore, although it has been specifically illustrated in the above embodiment that the principle of the present application is applied to a simple matrix driving-type display, it should be understood that the principle of the present application may be applied to an active matrix driving-type display.

It should be understood that various changes and modifications to the presently preferred embodiments described herein will be apparent to those skilled in the art. Such changes and modifications can be made without departing from the spirit and scope and without diminishing its intended advantages. It is therefore intended that such changes and modifications be covered by the appended claims.

The application is claimed as follows:

1. A mounting board comprising:
    a substrate;
    a plurality of first metal lines formed on the substrate and extending in a first direction, each first metal line having a conductive via portion formed thereon;
    an interlayer insulating film formed over the via portions and the first metal lines;
    a plurality of first metal contacts corresponding to the plurality of first metal lines, each first metal contact formed on one of the via portions and on portions of the interlayer insulating film surrounding the via portions;
    a plurality of second metal lines formed on the interlayer insulating film and extending in a second direction that is perpendicular to the first direction; and
    a plurality of second metal contacts corresponding to the plurality of second metal lines, each second metal contact formed on the interlayer insulating film and electrically connected to respective ends of the second metal lines,
    wherein the first metal contacts, the second metal lines, and the second metal contacts are formed from a single coplanar metal layer,
    wherein the first metal contacts are arranged in zigzags in the second direction, and the second metal contacts are arranged in zigzags in the first direction, and
    wherein each of the first metal contacts are formed over a plurality of first metal lines in plan view, and each of the second metal contacts are formed over a plurality of second metal lines in plan view.

2. The mounting board according to claim 1,
    wherein a width of the first metal contacts in the second direction is wider than a pitch of the first metal lines.

3. The mounting board according to claim 1,
    wherein the plurality of first metal lines intersects with the plurality of second metal lines when viewed from a normal direction of the substrate.

4. The mounting board according to claim 1, further comprising light emitting elements which are formed near intersections of the plurality of first metal lines and the plurality of second metal lines and are connected to the first metal lines and the second metal lines.

5. A display device comprising:
    a display panel including an image display region and a frame region which surrounds the image display region; and
    a driving IC mounted on the frame region,
    wherein the display panel further includes
        a substrate;
        a plurality of first metal lines formed on the substrate and extending in a first direction, each first metal line having a conductive via portion formed thereon,
        an interlayer insulating film formed over the via portions and the first metal lines,
        a plurality of first metal contacts corresponding to the plurality of first metal lines, each first metal contact formed on one of the via portions and on portions of the interlayer insulating film surrounding the via portions,
        a plurality of second metal lines formed on the interlayer insulating film and extending in a second direction that is perpendicular to the first direction, and
        a plurality of second metal contacts corresponding to the plurality of second metal lines, each second metal contact formed on the interlayer insulating film and electrically connected to respective ends of the second metal lines,
    wherein the first metal contacts, the second metal lines, and the second metal contacts are formed from a single coplanar metal layer, and
    wherein the first metal contacts are arranged in zigzags in the second direction, and the second metal contacts are arranged in zigzags in the first direction,
    wherein the driving IC is connected to the plurality of first metal contacts, and
    wherein each of the first metal contacts are formed over a plurality of first metal lines in plan view, and each of the second metal contacts are formed over a plurality of second metal lines in plan view.

6. The mounting board according to claim 1, wherein the first metal lines are data lines, and the second metal lines are scan lines.

7. The mounting board according to claim 1, wherein each of the first metal contacts covers at least a portion of at least three consecutive first metal lines.

8. The mounting board according to claim 1, wherein the first metal contacts are arranged in at least three rows in the second direction.

9. The mounting board according to claim 1, wherein the second metal contacts are arranged in at least three columns in the first direction.

10. The mounting board according to claim 1, wherein a pitch of the first metal contacts in the second direction is greater than a pitch of the first metal lines.

* * * * *